(12) United States Patent
Namba et al.

(10) Patent No.: US 6,953,651 B2
(45) Date of Patent: Oct. 11, 2005

(54) CHEMICAL AMPLIFYING TYPE POSITIVE RESIST COMPOSITION

(75) Inventors: Katsuhiko Namba, Hirakata (JP); Junji Nakanishi, Kyoto (JP); Yasunori Uetani, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 10 days.

(21) Appl. No.: 10/046,742

(22) Filed: Jan. 17, 2002

(65) Prior Publication Data

US 2002/0147259 A1 Oct. 10, 2002

(30) Foreign Application Priority Data

Jan. 19, 2001 (JP) .......................................... 2001-011291

(51) Int. Cl.[7] .............................. C08K 5/06; G03F 7/004
(52) U.S. Cl. .................... 430/270.1; 430/905; 430/910; 524/377
(58) Field of Search ............................. 430/270.1, 905, 430/910; 524/377

(56) References Cited

U.S. PATENT DOCUMENTS

| | | | | | |
|---|---|---|---|---|---|
| 5,922,505 | A | * | 7/1999 | Sonokawa | ................ 430/272.1 |
| 5,976,759 | A | | 11/1999 | Urano et al. | ............... 430/270.1 |
| 6,492,086 | B1 | * | 12/2002 | Barclay et al. | ........... 430/270.1 |
| 6,495,306 | B2 | * | 12/2002 | Uetani et al. | ............. 430/270.1 |
| 6,514,656 | B1 | * | 2/2003 | Nakamura et al. | ........... 430/157 |
| 6,548,220 | B2 | * | 4/2003 | Uetani et al. | ............. 430/270.1 |
| 2002/0164540 | A1 | * | 11/2002 | Nakanishi et al. | ........ 430/270.1 |
| 2003/0087179 | A1 | * | 5/2003 | Iwasaki | ....................... 430/166 |
| 2003/0099900 | A1 | * | 5/2003 | Yamada et al. | ........... 430/270.1 |
| 2003/0114589 | A1 | * | 6/2003 | Suetsugu et al. | ............ 525/132 |
| 2003/0119957 | A1 | * | 6/2003 | Kim et al. | ................... 524/317 |
| 2003/0215743 | A1 | * | 11/2003 | Goto | ........................ 430/271.1 |

FOREIGN PATENT DOCUMENTS

| | | |
|---|---|---|
| EP | 0 789 279 A1 | 8/1997 |
| JP | 10-048826 A | 2/1998 |
| JP | 2881969 B2 | 2/1999 |

OTHER PUBLICATIONS

JP 10–048826 Urano et al., abstract; Polymer Composition and Resist Material Containing the Same.*

Nozaki et al., Journal of Photopolymer Science and Technology, vol. 13, No. 3, pp. 397–404 (2000).

* cited by examiner

Primary Examiner—Yvette C Thornton
(74) Attorney, Agent, or Firm—Birch, Stewart, Kolasch & Birch, LLP

(57) ABSTRACT

A chemical amplifying type positive resist composition having excellent sensitivity and resolution, manifesting no generation of scum is provided, which comprises a resin which has a polymerization unit derived from hydroxystyrene and a polymerization unit derived from 2-ethyl-2-adamantyl (meth)acrylate, and is insoluble or poorly soluble itself in an alkali, but becomes alkali-soluble after dissociation of the above-mentioned acid unstable group by the action of an acid; a radiation sensitive acid generating agent; and polypropylene glycol.

6 Claims, No Drawings

CHEMICAL AMPLIFYING TYPE POSITIVE RESIST COMPOSITION

BACKGROUND OF THE INVENTION

The present invention relates to a resist composition suitable for lithography and the like, which acts by high energy radioactive ray such as far ultraviolet ray (including excimer laser and the like), electron beam, X ray or radiation light.

Recently, according to high integration of integrated circuits, submicron pattern formation is required. Particularly, lithography using a radiation source such as excimer laser light from krypton fluoride (KrF), argon fluoride (ArF) and fluorine ($F_2$), electron beams EUV light, X ray and the like is noticed since they enable fine pattern formation. As the resist suitable for a lithography process, a so-called chemical amplifying type resist utilizing an acid catalyst and chemical amplifying effect is adopted. In the chemical amplifying type resist, acids generated from an acid generating agent at a part irradiated with radiation are diffused by the subsequent heat treatment (post exposure bake; hereinafter, abbreviated as PEB in some cases), and the solubility of the irradiated part in an alkali developer is changed by a reaction using this acid as a catalyst. Thus, a positive or negative pattern is given.

In positive resists of chemical amplifying type, resins in which an alkali-soluble group is protected by a group which is dissociatable by the action of an acid are often used in combination with an acid generating agent. It is reported that high resolution and excellent dry etching resistance are obtained particularly by using a protective group such as a 2-alkyl-2-adamantyl group or 1-adamantyl-1-alkylalkyl group as shown in S. Takechi et al., J. Photopolym. Sci. Technol., Vol. 9, No. 3, 475–487 (1996) and JP-A-9-73173, as the group dissociatable by the action of an acid as described above. Nozaki et al., J. Photopolym. Sci. Technol., Vol. 13, No. 3, 397–403 (2000) discloses a resist for electron beam using a copolymer resin of 2-methyl-2-adamantyl methacrylate or 2-ethyl-2-adamentyl methacrylate with hydroxystyrene, and reports that particularly those using a copolymer resin of 2-ethyl-2-adamantyl methacrylate with hydroxystyrene have high sensitivity and are excellent in etching resistance, and provide high resolution in exposure to KrF excimer laser.

However, chemical amplifying type positive resists using a copolymer of 2-ethyl-2-adamantyl methacrylate with hydroxystyrene have a problem of generation of scum after development.

An object of the present invention is to provide a chemical amplifying type positive resist composition having excellent sensitivity and resolution and showing less scum problem.

The present inventors have intensively studied for attaining such objects. Resultantly, they have found that excellent performances can be obtained without generation of scum by using a specific copolymer as a resin component of a chemical amplifying type positive resist and allowing polypropylene glycol to be contained in the resist. Thus, the present invention was completed.

SUMMARY OF THE INVENTION

The present invention provides a chemical amplifying type positive resist composition comprising
a resin which has a polymerization unit derived from hydroxystyrene and a polymerization unit derived from 2-ethyl-2-adamantyl (meth)acrylate, and is insoluble or poorly soluble itself in an alkali, but becomes alkali-soluble after dissociation of the above-mentioned acid unstable group by the action of an acid;
a radiation sensitive acid generating agent; and
polypropylene glycol.

EMBODIMENTS OF THE INVENTION

The resin component in the resist composition of the present invention has essentially at least two polymerization units, a polymerization unit derived from hydroxystyrene and a polymerization unit derived from 2-ethyl-2-adamantyl (meth)acrylate. The resin component causes a chemical change by the action of an acid to become alkali-soluble though it is insoluble or poorly soluble itself in an alkali. These polymerization units are formed by opening of a double bond in a styrene part and a double bond in a (meth)acryl part, respectively, and specifically, can be represented by the following formula (I) and formula (II), respectively.

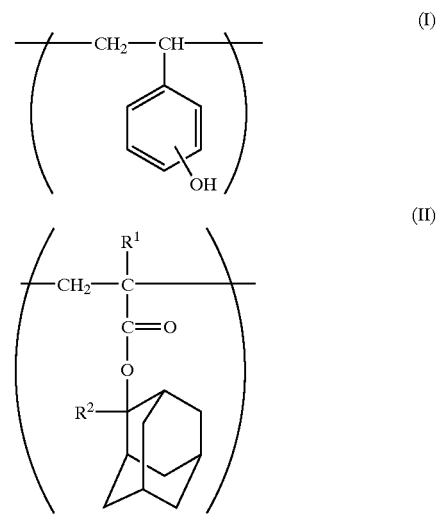

wherein, $R^1$ represents a hydrogen atom or methyl group, and $R^2$ represents an ethyl group.

In the hydroxystyrene unit of the formula (I), positional relation between a hydroxyl group and vinyl group is not particularly restricted, but p-hydroxystyrene is generally used.

The resin having a polymerization unit derived from hydroxystyrene and a polymerization unit derived from 2-ethyl-2-adamantyl (meth)acrylate can be produced, for example, as follows. First, acetoxystyrene and 2-ethyl-2-adamantyl (meth)acrylate are copolymerized by an ordinary method, then, the copolymer is hydrolyzed to a suitable degree to change a part or all of acetoxy groups into hydroxyl groups, to produce the resin.

The copolymerization using hydroxystyrene or acetoxystyrene and 2-ethyl-2-adamantyl (meth)acrylate, further, if necessary, a monomer having a group unstable to an acid and/or other monomers can be conducted according to an ordinary method. For example, a method is adopted in which raw material monomers are dissolved in a suitable solvent, a polymerization initiator is added to this solution to initiate polymerization, and the reaction is continued under heating or cooling. As the reaction solvent, alcohols such as methanol, ethanol, 2-propanol and tert-butanol, aromatic hydrocarbons such as benzene, toluene and xylene, ethers such as tetrahydrofuran and 1,4-dioxane, and the like can be used. As the polymerization initiator, azo compounds such as 2,2'-azobis(isobutyronitrile) and dimethyl 2,2'-azobis(2-methylpropionate), peroxides such as benzoyl peroxide and tert-butyl peroxide, redox type initiators such as hydrogen peroxide/ferrous salt and benzoyl peroxide/dimethylaniline, alkylated metals such as butyllithium and triethylaluminum, and the like can be used.

In addition to a polymerization unit derived from hydroxystyrene and a polymerization unit derived from 2-ethyl-2-adamantyl (meth)acrylate, as described above, the resin component constituting the positive resist composition of the present invention may further contain other polymerization units, for example, polymerization units derived from styrene, acrylonitrile, methyl methacrylate, methyl acrylate and the like. Further, the resin component may be partially hydrogenated, or an alkyl group, alkoxy group and the like may also be introduced in a phenol nuclei in amount maintaining alkali-solubility, for improvement of transparency.

However, it is preferable that the total amount of a polymerization unit derived from hydroxystyrene and a polymerization unit derived from 2-ethyl-2-adamantyl (meth)acrylate occupies 50 mol % or more based on the whole polymerization units in the resin. The ratio of these polymerization units is usually from 99:1 to 60:40, preferably from 95:5 to 70:30 in terms of molar ratio of polymerization unit derived from hydroxystyrene to polymerization unit derived from 2-ethyl-2-adamantyl (meth)acrylate. The proportion of a polymerization unit having a group unstable to an acid is usually 50 mol % or less, preferably 10 mol % or more and 45 mol % or less.

The acid generating agent used in the present invention is a substance which is decomposed to generate an acid by applying a radiation such as a light, an electron beam or the like on the substance itself or on a resist composition containing the substance. The acid generated from the acid generating agent acts on said resin resulting in cleavage of the group cleavable by the action of an acid existing in the resin.

Such acid generating agents, for example, include other onium salt compounds, organo-halogen compound such as 1,3,5-triazine compounds, sulfone compounds, sulfonate compounds, and the like.

Specific examples thereof include:
diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
triphenylsulfonium 2,4,6-triisopropylbenzenesulfonate,
4-methylphenyldiphenylsulfonium perfluorobutanesulfonate,
4-methylphenyldiphenylsulfonium perfluorooctanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxy imide,
N-(trifluoromethylsulfonyloxy)naphthalimide,
N-(10-camphorsulfonyloxy)naphthalimide, and the like.
(5-propylsulfonyloxyimino-5H-thiophene-2-yliden)-(2-methylphenyl)acetonitrile,
(5-toluylsulfonyloxyimino-5H-thiophene-2-yliden)-(2-methylphenyl)acetonitrile,
(5-n-butylsulfonyloxyimino-5H-thiophene-2-yliden)-(2-methylphenyl)acetonitrile,
(5-n-octylsulfonyloxyimino-5H-thiophene-2-yliden)-2-methylphenyl)acetonitrile, and the like.

Polypropylene glycol which is another component of the positive resist composition of the present invention can prevent generation of scum by promoting generation of an acid and dissociation of a group unstable to an acid when an acid generated from an acid generating agent by light and heat acts on the above-mentioned resin to dissociate a group unstable to an acid.

The content of propylene glycol used here is appropriately selected depending on the kind of the photoresist composition, and is from 0.1 to 5% by weight of total solid contents in the resist. The molecular weight of polypropylene glycol is appropriately selected depending on the kind of photoresist composition, and usually from 500 to 5000 in terms of weight-average molecular weight.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. Concrete examples of the basic compounds to be used in the present invention as quenchers include the ones represented by the following formulae:

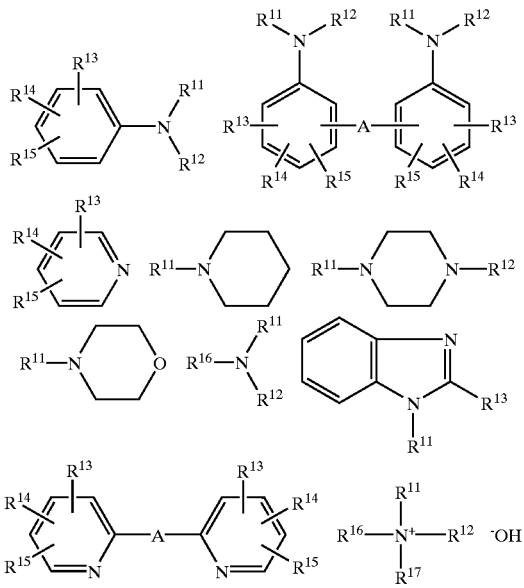

wherein $R^{11}$, $R^{12}$ and $R^{17}$ represent, independently each other, hydrogen, cycloalkyl, aryl or alkyl which may be optionally substituted with a hydroxyl, amino which may be optionally substitiuted with alkyl having 1 to 6 carbon atoms, or alkoxy having 1 to 6 carbon atoms; $R^{13}$, $R^{14}$ and $R^{15}$, which are same or different from each other, represent hydrogen, cycloalkyl, aryl, alkoxy or alkyl which may be optionally substituted with a hydroxyl, amino which may be optionally substitiuted with alkyl having 1 to 6 carbon atoms, or alkoxy having 1 to 6 carbon atoms; $R^{16}$ represents cycloalkyl or alkyl which may be optionally substituted with a hydroxyl, amino which may be optionally substitiuted with alkyl having 1 to 6 carbon atoms, or alkoxy having 1 to 6 carbon atoms; A represents alkyl, alkylene, carbonyl, imino, sulfide, disulfide or a secondary amine. The alkyl represented by R11 to R17 and alkoxy represented by $R^{13}$ to $R^{15}$ may have about 1 to 6 carbon atoms. The cycloalkyl represented by $R^{11}$ to $R^{17}$ may have about 5 to 10 carbon atoms and the aryl represented by $R^{11}$ to $R^{15}$ and $R^{17}$ may have about 6 to 10 carbon atoms. The alkylene represented by A may have about 1 to 6 carbon atoms and may be straight-chained or branched.

Hindered amine compounds having piperidine skeleton, such as those disclosed in JP-A-11-52575, can also be used as quenchers.

The resist composition of the present invention preferably contains the resin in an amount of 80 to 99.9% by weight, and the acid generating agent in an amount of 0.1 to 20% by weight based on the total solid component weight of the resist composition. When a basic compound is used as a quencher, it is preferably contained in an amount of 1% by weight or less based on the total solid component weight of the resist composition. The composition may also contain, if required, a small amount of various additives such as sensitizers, dissolution inhibitors, resins other than the above resin, surfactants, stabilizers, and dyes so far as the objects of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field.

Examples thereof include glycol ether esters such as ethylcellosolve acetate, methylcellosolve acetate and propylene glycol monomethyl ether acetate; esters such as ethyl lactate, butyl acetate, amyl acetate and ethyl pyruvate; ketones such as acetone, methyl isobutyl ketone, 2-heptanone and cyclohexanone; cyclic esters such as γ-butyrolactone; and alcohols such as 3-methoxy-1-butanol. These solvents can be used alone or in combination of two or more thereof.

The resist film applied on a substrate, and dried is subjected to an exposure treatment for patterning. Then, after a heat-treatment (PEB) for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)tetramethylammoniumhydroxide (so-called colline) is often used.

The present invention will be described in more detail by way of examples, which should not be construed as limiting the scope of the present invention. All "%" and parts for representing content or used amount in examples are by weight unless otherwise stated. The weight-average molecular weight (Mw) or degree of dispersion (Mw/Mn) is a value determined from gel permeation chromatography using polystyrene as a reference standard.

(1a) Synthesis of Copolymer of 2-ethyl-2-adamantyl Methacrylate and p-acetoxystyrene (20:80)

Into a flask was charged 39.7 g (0.16 mol) of 2-ethyl-2-adamentyl methacrylate, 103.8 g (0.64 mol) of p-acetoxystyrene and 265 g of isopropanol and the atmosphere was purged with nitrogen. The resultant solution was heated to 75° C. Into this solution, 11.05 g (0.048 mol) of dimethyl 2,2'-azobis(2-methylpropionate) dissolved in 22.11 g of isopropanol was added dropwise. The mixture was kept for about 0.3 hours at 75° C. and for about 12 hours under reflux. Then, the mixture was diluted with acetone, and charged into methanol to precipitate a crystal which was removed by filtration. The crude crystal of the copolymer of 2-ethyl-2-adamantyl methacrylate and p-acetoxystyrene was obtained in an amount of 250 g.

(1b) Synthesis of Copolymer of 2-ethyl-2-adamantyl Methacrylate and p-hydroxystyrene (20:80)

Into a flask was charged 250 g of the crude crystal of the copolymer of 2-ethyl-2-adamantyl methacrylate and p-acetoxystyrene (20:80) obtained in (1a), 10.3 g (0.084 mol) of 4-dimethylaminopyridine and 202 g methanol. The resultant solution was kept for 20 hours under reflux. After cooling, the solution was neutralized with 7.6 g (0.126 mol) of glacial acetic acid, and charged into water to precipitate a crystal which was removed by filtration. Then, the crystal was dissolved in acetone, and charged into water to precipitate a crystal which was removed by filtration. This operation was repeated three times in total, then, the resulted crystal was dried. The crystal of the copolymer of 2-ethyl-2-adamantyl methacrylate and p-hydroxystyrene was obtained in an amount of 95.9 g. The resin had a weight-average molecular weight of about 8600 and a degree of dispersion of 1.65 (GPC method: in terms of polystyrene), and revealed a copolymerization ratio of about 20:80 measured by a nuclear magnetic resonance ($^{13}$C-NMR) spectrometer. This resin is called Resin A.

(2a) Synthesis of Copolymer of 2-ethyl-2-adamantyl Methacrylate and p-acetoxystyrene (30:70)

Into a flask was charged 59.6 g (0.24 mol) of 2-ethyl-2-adamantyl methacrylate, 90.8 g (0.56 mol) of p-acetoxystyrene and 279 g of isopropanol and the atmosphere was purged with nitrogen. Then, the solution was heated to 75° C. Into this solution, 11.05 g (0.048 mol) of dimethyl 2,2'-azobis(2-methylpropionate) dissolved in 22.11 g of isopropanol was added dropwise. The mixture was kept for about 0.3 hours at 75° C. and for about 12 hours under reflux, then, diluted with acetone, and charged into methanol to precipitate a crystal which was removed by filtration. The crude crystal of the copolymer of 2-ethyl-2-adamantyl methacrylate and p-acetoxystyrene was obtained in an amount of 250 g.

(2b) Synthesis of Copolymer of 2-ethyl-2-adamantyl Methacrylate and p-hydroxystyrene (30:70)

Into a flask was charged 250 g of the crude crystal of the copolymer of 2-ethyl-2-adamantyl methacrylate and p-acetoxystyrene (30:70) obtained in (2a), 10.8 g (0.088 mol) of 4-dimethylaminopyridine and 239 g methanol. Then, the solution was kept for 20 hours under reflux. After cooling, the solution was neutralized with 8.0 g (0.133 mol) of glacial acetic acid, and charged into water to precipitate a crystal which was removed by filtration. Then, the crystal was dissolved in acetone, and charged into water to precipitate a crystal which was removed by filtration. This operation was repeated three times in total, then, the resulted crystal was dried. The crystal of the copolymer of 2-ethyl-2-adamantyl methacrylate and p-hydroxystyrene was obtained in an amount of 102.8 g. The resin had a weight-average molecular weight of about 8200 and a degree of dispersion of 1.68 (GPC method: in terms of polystyrene), and revealed a copolymerization ratio of about 30:70 measured by a nuclear magnetic resonance ($^{13}$C-NMR) spectrometer. This resin is called Resin B.

EXAMPLES AND COMPARATIVE EXAMPLE

Resin A and Resin B was mixed at a ratio of 1:1 to give a resin, and this resin was mixed with acid generating agents of the following formulae (III) and (IV), quencher and solvent in a formulation shown below to provide a solution. This solution was further filtrated through a fluorine resin filter having a pore diameter of 0.2 μm to prepare a resist solution.

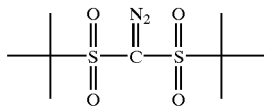
(III)

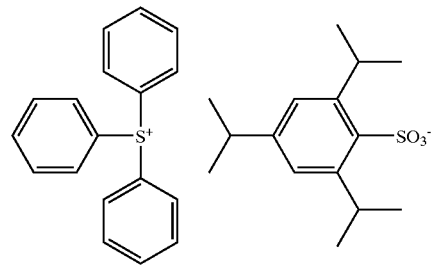
(IV)

| Resin mixture | | 13.5 parts |
|---|---|---|
| Acid generating agent | acid generating agent (III) | 0.45 parts |
| | acid generating agent (IV) | 0.45 parts |
| Quencher | diisopropylaniline | 0.055 parts |
| Solvent | propylene glycol monomethyl ether acetate | 90 parts |

To this resist solution was added polypropylene glycols (PPG) having weight-average molecular weights shown in Table 1 in an amount of 10% based on the resin solid content.

TABLE 1

| Example No. | Molecular weight of PPG |
|---|---|
| Example 1 | 1000 |
| Example 2 | 2000 |
| Example 3 | 3000 |
| Comparative example 1 | No addition |

On a silicon wafer, an anti-reflection film ["DUV-42" manufactured by Nissan Chemical Industries. Ltd.] was applied under pre-bake conditions of 215° C. and 60 seconds to give a thickness of 0.06 μm. Then, each resist solution was spin-coated on this, followed by pre-baking on a proximity hot plate under conditions of 110° C. and 60 seconds to form a resist film having a thickness of 0.42 μm. A wafer carrying thus formed resist film was exposed using a KrF excimer stepper ["NSR S203B" manufactured by Nikon Corp., NA=0.68, σ=0.85, ⅔ annular illumination] via masks having various forms and dimensions. Then, PEB was conducted under conditions of 130° C. and 60 seconds on a hot plate, further, paddle development was conducted for 60 seconds with a 2.38% tetramethyl ammonium hydroxide aqueous solution. Patterns after development were observed by a scanning electron microscope, and sensitivity, resolution and presence of scum were checked as described below. Results are shown in Table 2.

Film penetrating sensitivity: This was indicated by the minimum exposure required for film penetration of 2 mm square open field after exposure and development. This is represented by Eth.

Effective sensitivity: This was indicated by exposure amount at which 0.13 μm line and space pattern was 1:1. This is represented by Eo.

Presence of scum: A wafer carrying patterns formed at exposure at which 0.15 μm line and space pattern was 1:1 was observed from the upper surface using a scanning electron microscope, and presence of scum (residue) at exposed parts was checked. Observation of one or more scums was represented by X, and observation of no scum was represented by ○.

Resolution: This was indicated by the minimum dimension of line and space pattern separating at exposure of effective sensitivity.

TABLE 2

| Example No. | Molecular weight of PPG | Sensitivity (mJ/cm$_2$) Eth | Eo | Resolution (μm) | Presence of scum |
|---|---|---|---|---|---|
| Example 1 | 1000 | 11 | 32 | 0.13 | ○ |
| Example 2 | 2000 | 11 | 32 | 0.13 | ○ |
| Example 3 | 3000 | 11 | 32 | 0.13 | ○ |
| Comparative example 1 | | 11 | 32 | 0.13 | X |

The resist composition of the present invention has excellent sensitivity and resolution, and manifests no generation of scum. Therefore, fine resist patterns can be formed with good precision by using this composition.

What is claimed is:

1. A chemical amplifying type positive resist composition comprising
   a resin which has a polymerization unit derived from hydroxystyrene and a polymerization unit derived from 2-ethyl-2-adamantyl (meth)acrylate, and is insoluble or poorly soluble itself in an alkali, but becomes alkali-soluble after dissociation of the above-mentioned acid unstable group by the action of an acid;
   a radiation sensitive acid generating agent comprising a sulfonium salt; and
   polypropylene glycol.

2. The chemical amplifying type positive resist composition according to claim 1, wherein content of the propylene glycol is from 0.1 to 5% by weight of the total solid content in the resist.

3. The chemical amplifying type positive resist composition according to claim 1, wherein weight-average molecular weight of the polypropylene glycol is from 500 to 5000.

4. The chemical amplifying type positive resist composition according to claim 2, wherein weight-average molecular weight of the polypropylene glycol is from 500 to 5000.

5. The chemical amplifying type positive resist composition according to claim 4, wherein the sulfonium salt is triphenylsulfonium 2,4,6-triisopropylbenzenesulfonate.

6. The chemical amplifying type positive resist composition according to claim 1, wherein the sulfonium salt is triphenylsulfonium 2,4,6-triisopropylbenzenesulfonate.

* * * * *